United States Patent [19]

Zurfluh

[11] Patent Number: 4,677,648
[45] Date of Patent: Jun. 30, 1987

[54] DIGITAL PHASE LOCKED LOOP SYNCHRONIZER

[75] Inventor: Erwin A. Zurfluh, Feldmeilen, Switzerland

[73] Assignee: International Business Machines Corp., Armonk, N.Y.

[21] Appl. No.: 805,002

[22] Filed: Dec. 5, 1985

[30] Foreign Application Priority Data

Dec. 21, 1984 [EP] European Pat. Off. ........ 84115639.1

[51] Int. Cl.[4] .............................................. H03D 3/24
[52] U.S. Cl. ..................................... 375/120; 375/82; 328/56
[58] Field of Search ..................... 375/80, 81, 82, 106, 375/111, 113, 119, 120; 370/100, 108; 371/42, 46; 328/55, 56, 63, 72; 307/231, 514

[56] References Cited

U.S. PATENT DOCUMENTS

| | | | |
|---|---|---|---|
| 3,037,568 | 6/1962 | Hannum | 370/108 |
| 3,369,220 | 2/1968 | Buyer et al. | 328/55 |
| 3,509,471 | 4/1970 | Puente | 375/120 |
| 3,588,707 | 6/1971 | Manship | 328/55 |
| 3,908,084 | 9/1975 | Wiley | 375/119 |
| 3,947,638 | 3/1976 | Blankinship | 328/55 |
| 3,969,582 | 7/1976 | van Duvren et al. | 375/111 |
| 4,103,234 | 7/1978 | Frazier, Jr. | 375/111 |
| 4,119,796 | 10/1978 | Jones | 375/111 |
| 4,241,418 | 12/1980 | Stanley | 328/63 |
| 4,443,766 | 4/1984 | Belton, Jr. | 328/56 |
| 4,472,686 | 9/1984 | Nishimura et al. | 375/120 |

FOREIGN PATENT DOCUMENTS

2069263 8/1981 United Kingdom .

OTHER PUBLICATIONS

Lindsey and Chie, "A Survey of Digital Phase-Locked Loop" Proceeding of IEEE, vol. 69, No. 4, Apr. 1981, pp. 410–430.

Leung, "Digital Phase-Locked Loop Circuit", IBM Technical Disclosure Bulletin, vol. 18, No. 10, Mar. 1976.

Homan, "Electronically Adjustable Computer Clock System", IBM Technical Disclosure Bulletin, vol. 15, No. 1, Jun. 1972.

*Primary Examiner*—Robert L. Griffin
*Assistant Examiner*—Stephen Chin
*Attorney, Agent, or Firm*—John B. Frisone

[57] ABSTRACT

A phase locked loop (PLL) arrangement comprising a local crystal oscillator (23) and a tapped delay chain (15) of analog delay elements (17). Connected to the delay chain taps are a flash register (25) consisting of latches which store the tap signal values at each data signal transition, and an output multiplexer (37) for selecting one of the tap signals as phase shifted output clock. Contents of the flash register are encoded by an encoder (33) which furnishes a value representing the phase offset between data signal and local clock signal. By a look-up table (41), the phase offset is converted to a phase selection value controlling the output multiplexer. The delay chain serves two purposes: Phase offset detection and clock signal phase shifting. No sampling or control signals are used which have a higher frequency than that of the system clock.

13 Claims, 8 Drawing Figures

HIGH ORDER DIGITAL FLASH PLL

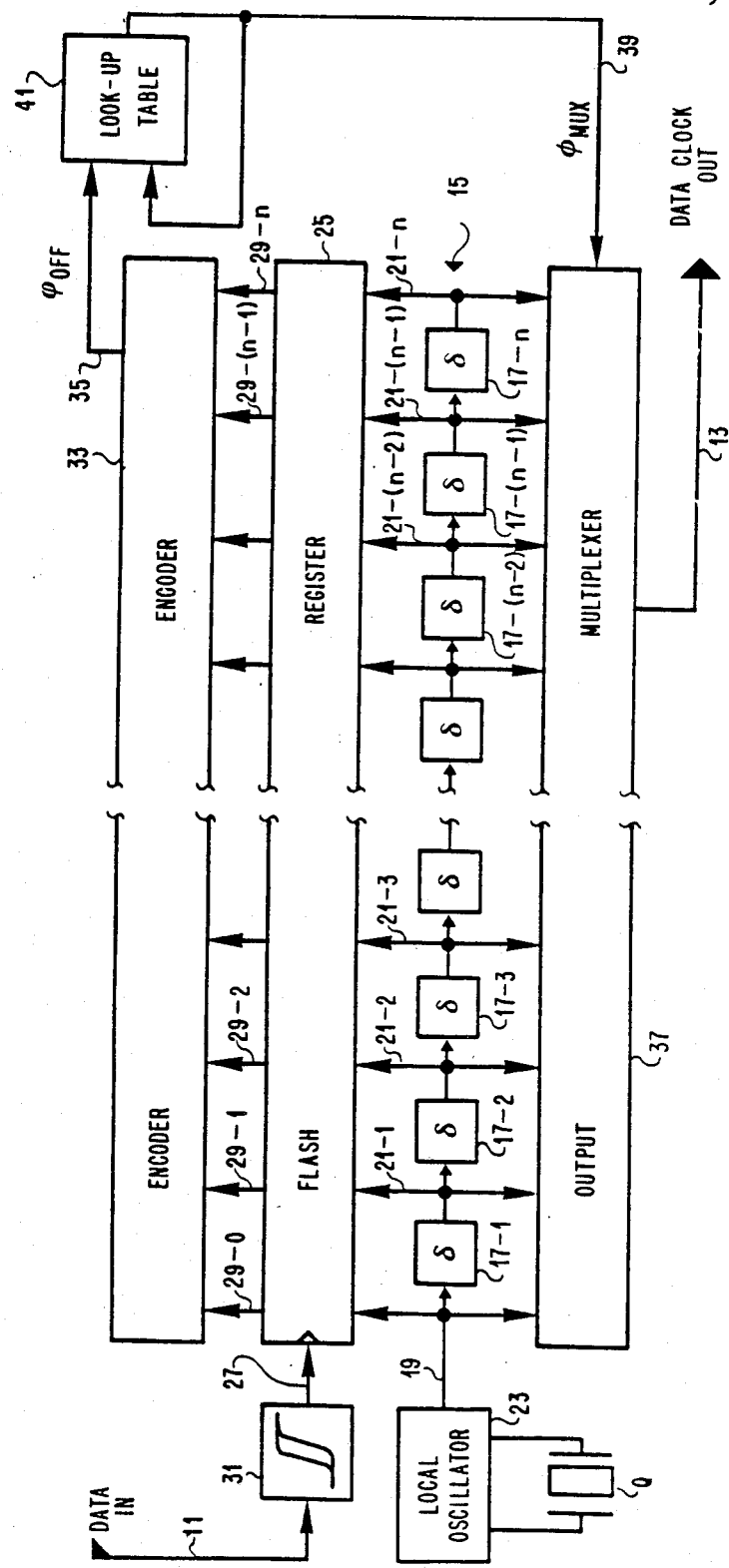
FIG. 1 FUNDAMENTAL DIGITAL FLASH PLL

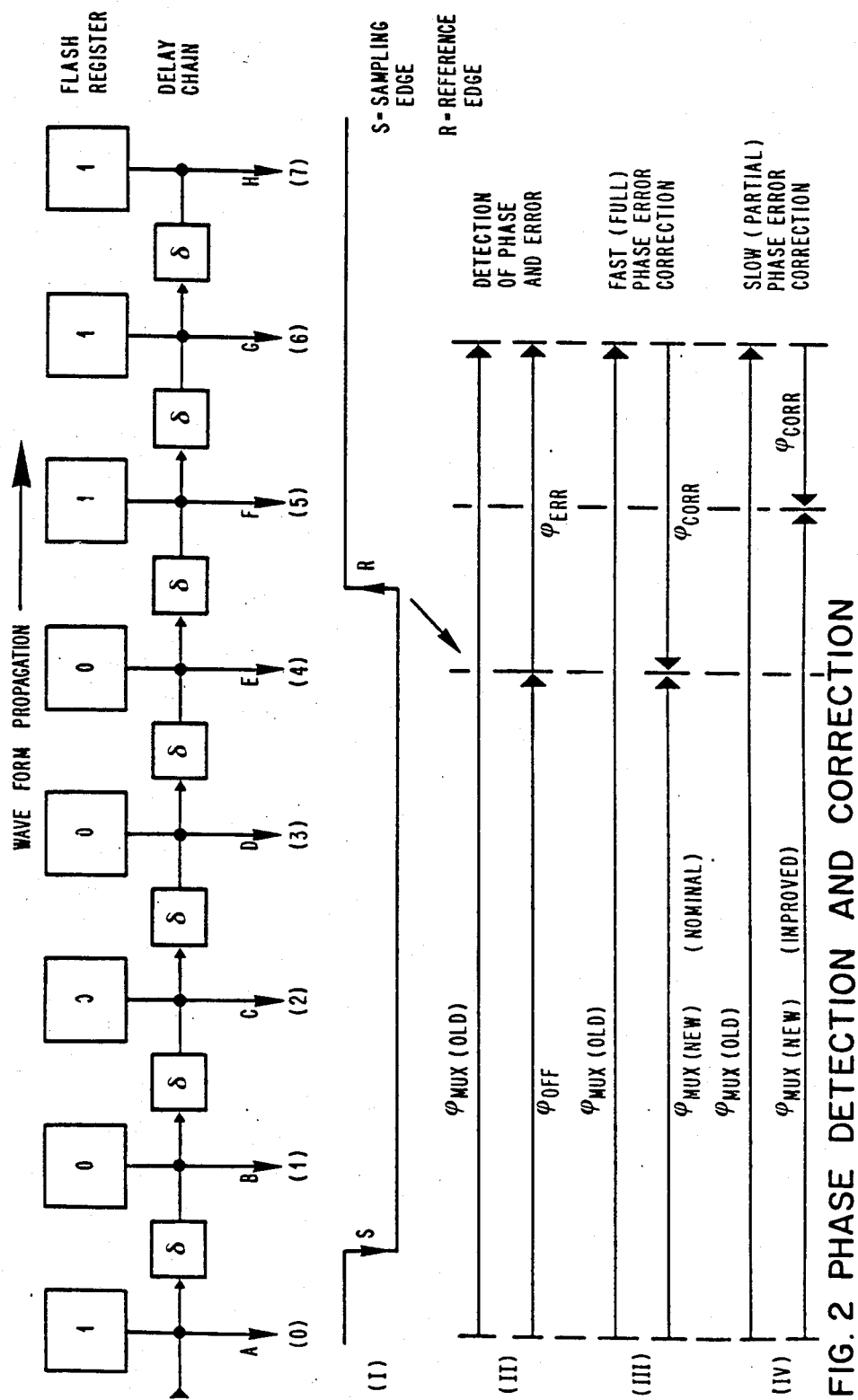
FIG. 2 PHASE DETECTION AND CORRECTION

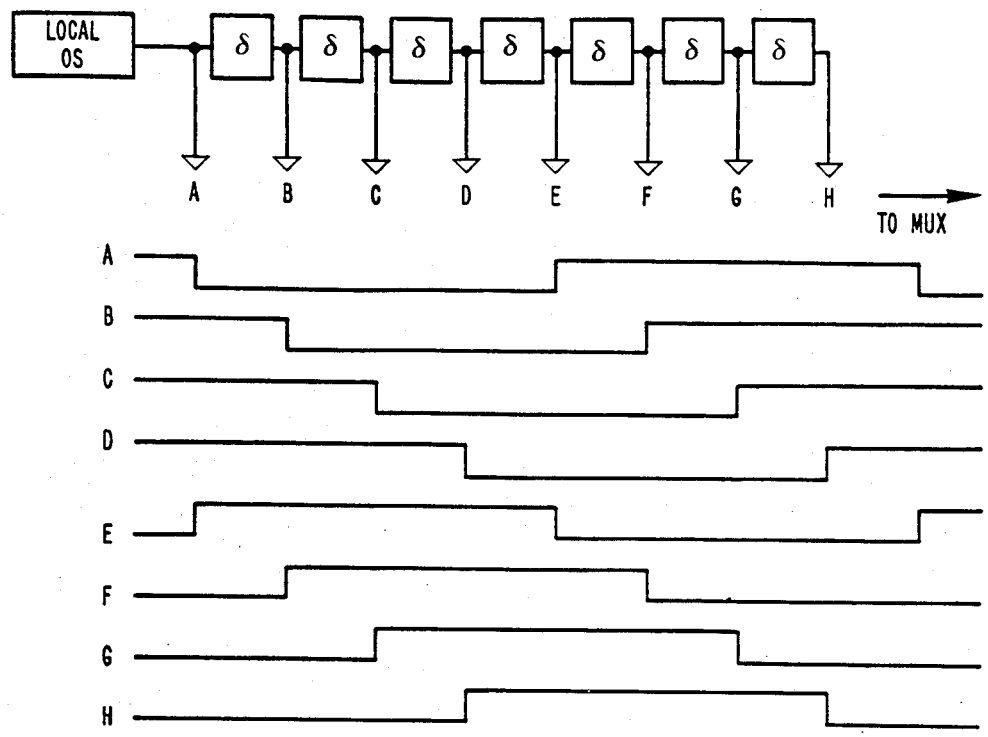
FIG. 3 DELAY CHAIN – PHASE SHIFTING
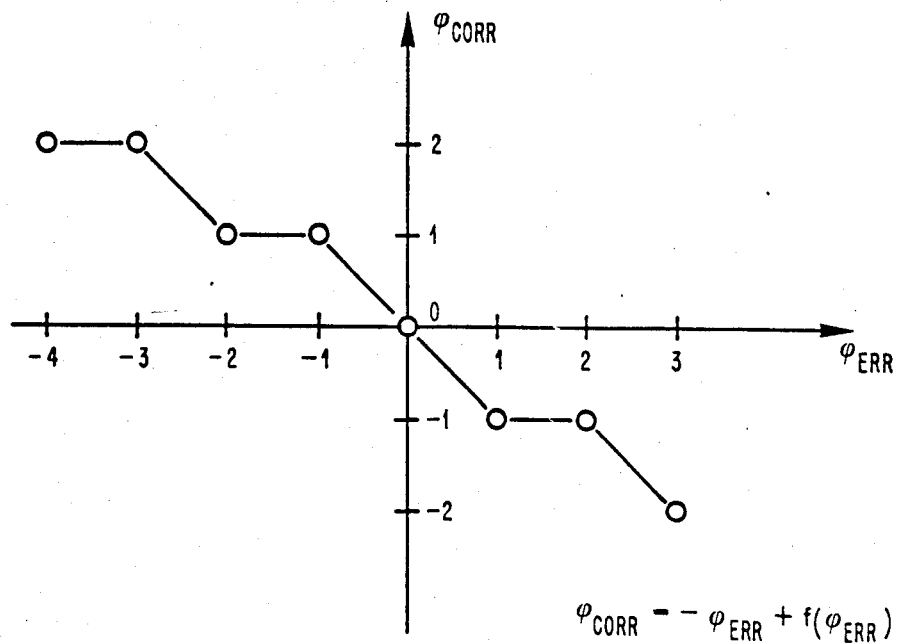
$$\varphi_{CORR} = -\varphi_{ERR} + f(\varphi_{ERR})$$
FIG. 4 PHASE CORRECTION FUNCTION

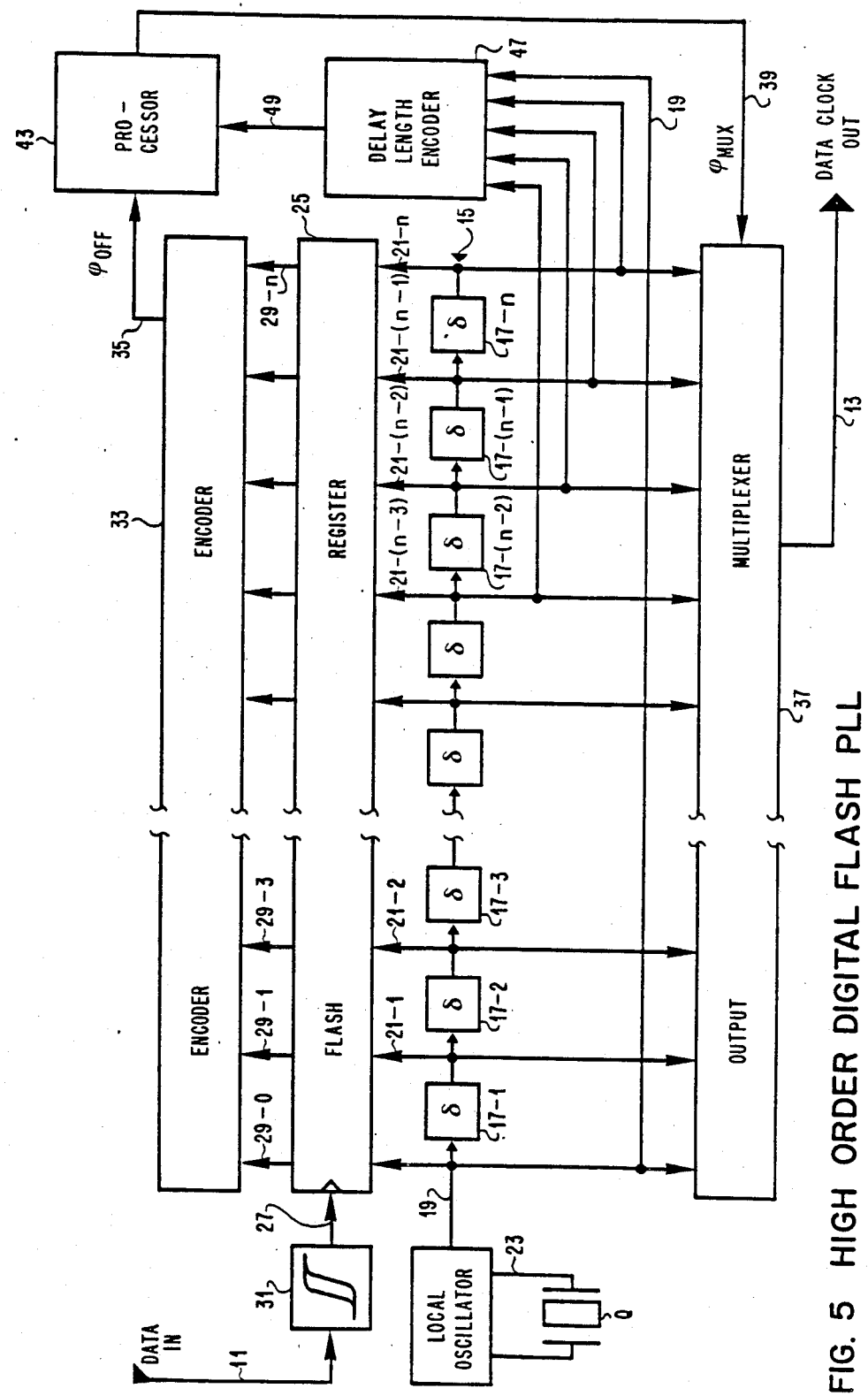
FIG. 5 HIGH ORDER DIGITAL FLASH PLL

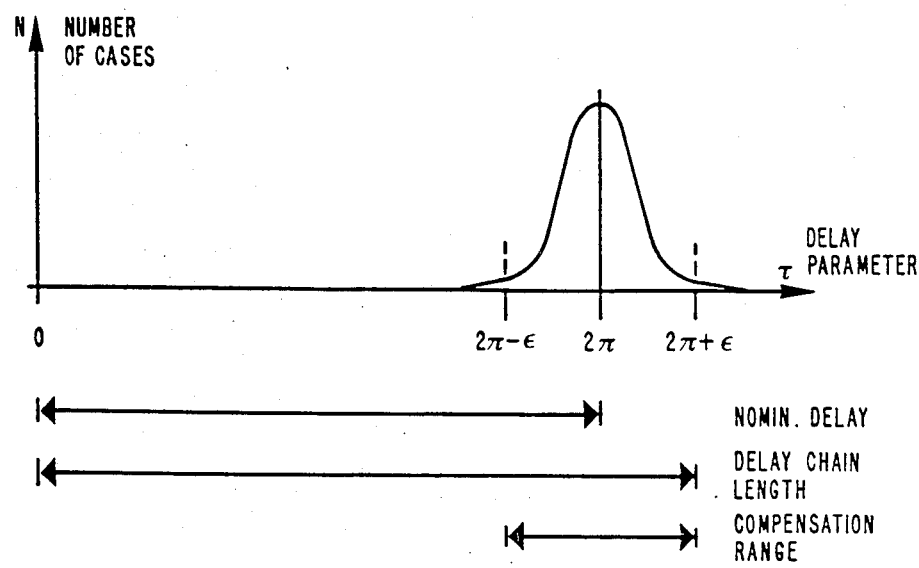
FIG. 6 PROPAGATION DELAY DISTRIBUTION
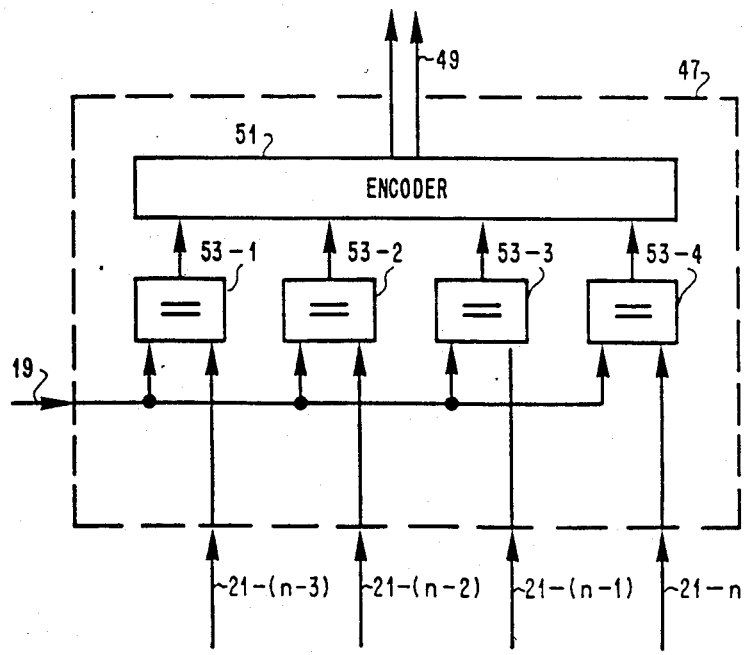
FIG. 7 DELAY LENGTH ENCODER

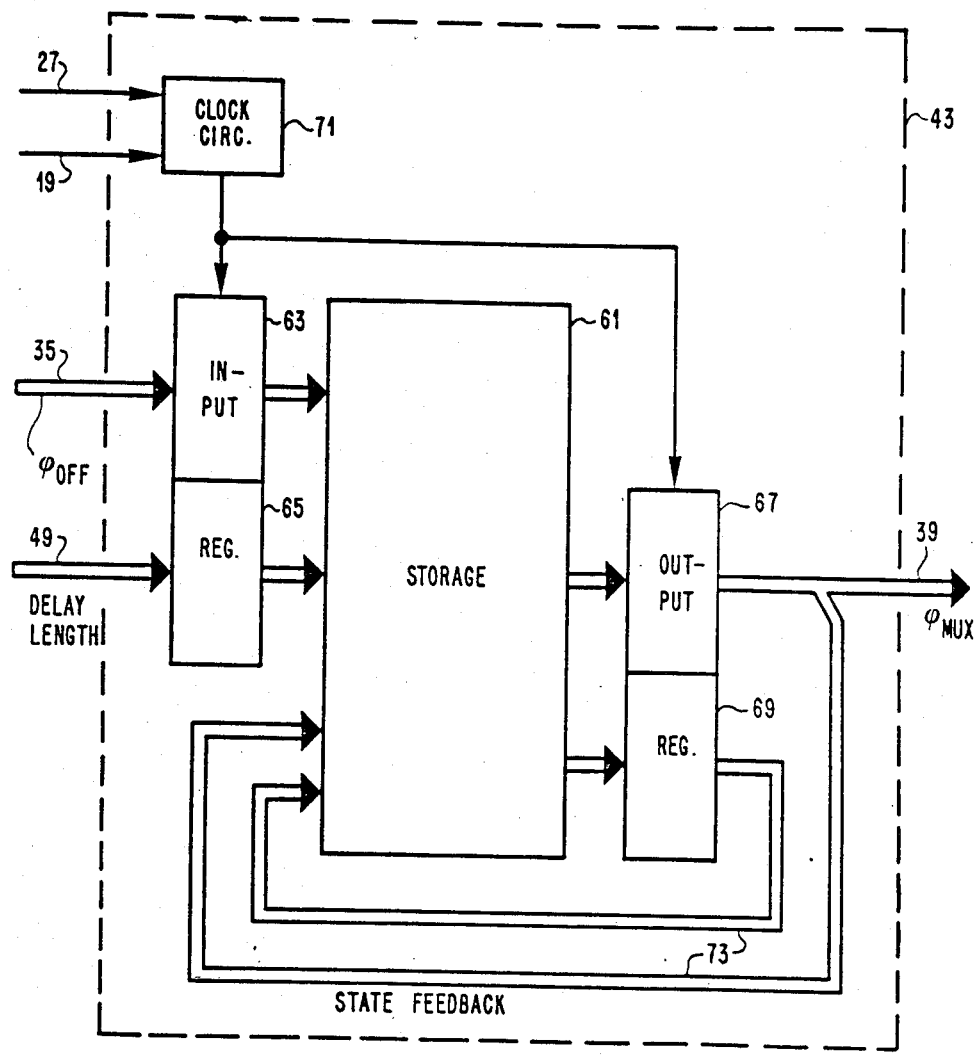
FIG. 8 PROCESSOR

DIGITAL PHASE LOCKED LOOP SYNCHRONIZER

FIELD OF INVENTION

The present invention is related to phase locked loops, and in particular to digital phase locked loops for obtaining a local clock signal that is synchronized to a received data signal.

BACKGROUND OF THE INVENTION

In digital baseband communication networks, the data sampling clock is usually recovered from the incoming data stream because no separate clock signal is provided. In many such communication systems, phase locked loops (PLLs) are used for locally maintaining in remote stations a clock signal that corresponds in frequency and phase to the clock of data signals that were transmitted through the network and received by the station. The difference between the local clock signal and that recovered from received data is monitored and the phase or frequency of the local clock is adapted and "locked" to that of the received data signal, or is maintained at the last status as long as no data are available or received.

Phase locked loop circuits were first implemented in analog technique. The basic design includes a phase detector, a loop filter, and a voltage controlled oscillator (VCO). The phase detector determines the phase error between the incoming data and the VCO output signal. The loop filter, in response to the phase error signal, generates a control signal for the VCO.

In a digital environment, digital PLLs are clearly preferred because they can be implemented easier in LSI techniques than analog PLLs. Many different digital PLL schemes were designed. A general survey is given in an article by W. C. Lindsay et al.: "Survey of Digital Phase-Locked Loops", Proceedings of the IEEE, Vol. 69, No. 4, April 1981, pp. 410–431.

The digital nature of the conventional phase detector which is used in digital PLLs requires, because of serial sampling, a control clock frequency which is n times higher than the data clock to be processed, where n is the number of discrete phase values which the detector can distinguish (usually n=16). This constraint limits the application of digital PLLs to low data rate transmission systems.

Various phase locked loop circuits and clock signal phase shifting circuits were described in the literature, and a selection of such known circuit descriptions is listed and briefly analyzed below.

W. C. Leung: Digital phase-locked loop circuit. IBM Technical Disclosure Bulletin, Vol. 18, No. 10, March 1976, pp. 3334–3337. This article describes a PLL which uses shift registers and selection logic to obtain a variable delay. The shift registers must operate at much higher speed than the generated clock frequency.

M. E. Homan: Electronically adjustable computer clocking system. IBM Technical Disclosure Bulletin, Vol. 15, No. 1, June 1972, pp. 252–254. This publication discloses an arrangement comprising a tapped delay chain with selection logic to obtain a variable phase shift, but it does not provide for the detection of a phase error between a clock and a data signal for controlling a phase error correction of the clock signal.

L. A. Laurich et al.: Phase lock loop with delay line oscillator. IBM Technical Disclosure Bulletin, Vol. 13, No. 7, December 1970, pp. 1863–1864. The PLL described in this article uses tapped delay lines as clock oscillator components, and it has a counter for clock oscillator pulses and stores the counter contents as error indication under control of input data. Outputs of the tapped delay lines are selected in response to the error indication for changing the oscillator frequency. The counter and some of the evaluation circuitry must operate at a speed which is a multiple of the generated clock frequency.

L. A. Laurich: Phase lock loop with variable delay line generator. IBM Technical Disclosure Bulletin, Vol. 13, No. 7, December 1970, pp. 1861–1862. This publication also discloses a PLL which uses tapped delay lines as oscillator components controlled by logic to selectively change the oscillator frequency. Pulses from a master oscillator are furnished to a two-stage shift register between occurrences of clock signal and data signal transitions, thus obtaining an error indication which controls the tap selection logic. All digital elements must operate at a multiple speed of the data clock.

OBJECTS OF THE INVENTION

It is an object of the invention to provide a digital phase locked loop which uses no sampling or control signals having a higher frequency than the system clock and which thus requires no elements which operate at a higher rate than that of the clock signal furnished by the PLL.

It is a further object to devise such a phase locked loop in which the only required element of relatively high precision is a local oscillator contained in the PLL.

Another object of the invention is a phase locked loop which is so designed that it optimally utilizes its components.

DISCLOSURE OF THE INVENTION

According to the invention, a local oscillator clock signal of given frequency is furnished to an analog delay chain which is used in a dual function, i.e. for determining the phase offset between a data signal and a locally generated clock signal, and for obtaining a phase shifted signal. Evaluation means, upon occurrence of a data signal transition, obtain the bi-level tap signal values as phase offset indication and generate an appropriate phase selection signal which selects one of the delay line tap signals as the output clock signal.

The evaluation means may comprise an array of binary latches which store the momentary tap values in digital form, and an encoder connected to the latches for generating a phase offset value from the stored tap output values. The evaluation means may also comprise a look-up table for converting the phase offset value to a phase selection signal or output tap selection signal. For a high-order PLL, the evaluation means may comprise a processor which generates the phase selection or output tap selection signal from a present and previous phase offset values generated by the encoder.

A delay length encoder connected to the last taps of the delay chain as well as to its input can compare the bi-level clock signal levels which are currently available at the input and at these last taps; it can thus determine the delay chain length or number of delay chain elements that corresponds exactly to the clock signal period, and can effect corrective measures to adapt the effective delay chain length for avoiding ambiguities.

The invention and its advantages will become more apparent from the following description of two embodiments of the invention as illustrated by accompanying drawings.

BRIEF DESCRIPTION OF THE DRAWINGS

FIG. 1 is a block diagram of a first embodiment of the invented PLL, comprising a look-up table for selection signal generation;

FIG. 2 is an illustration of the phase detection and correction technique using a stored digital representation of the delayed clock signal as it was available from the taps at a data signal transition;

FIG. 3 illustrates the operation of the delay chain as a phase shifter;

FIG. 4 is a diagram illustrating the phase correction function of the look-up table of the PLL shown in FIG. 1;

FIG. 5 is a block diagram of a second embodiment of the invented PLL, comprising a processor for evaluating present and past phase offset values to achieve high-order operation, and encoding circuitry for determining an effective delay chain length that corresponds to the clock period;

FIG. 6 is a diagram showing the interval of possible delay variations and the required compensation range of the delay length encoding circuitry in the PLL of FIG. 5;

FIG. 7 is a block diagram of an embodiment of the delay length encoding circuitry comprised in the PLL of FIG. 5; and FIG. 8 is a block diagram of the phase selection value determining processor in the PLL embodiment of FIG. 5.

DETAILED DESCRIPTION (1) Fundamental Digital Flash PLL

FIG. 1 shows a block diagram of the basic embodiment of the invented phase locked loop (PLL). It is suitable for frequencies in the order from 0.5 MHz up to 100 MHz.

As usual for each PLL, the PLL of FIG. 1 has an input 11 to which the input data are furnished of which the clock is to be extracted. It has an output 13 at which the data clock that was derived from the input data is available.

The heart of the PLL is a delay chain 15 which consists of n analog delay elements 17-1, 17-2, 17-3, ... 17-n each of which has a delay of about $1/(n+1)$ of a local oscillator period. The delay of each element corresponds the desired phase resolution. The delay chain has an input 19, and comprises after each delay element a respective tap 21-1, 21-2, 21-3, ... 21-n. The total delay of n+1 delay elements should correspond to the period of the data clock that is used in the respective system. (I.e., for a clock period T and a resolution of $\frac{1}{8}$, seven delay elements are used each having a delay T/8.) Instead of a chain of discrete delay elements, one could use of course a tapped continuous delay line (low frequencies) or a series of gates with their inherent propagation delay (high frequencies). If the delay chain is implemented monolithically in a chip as a chain of gates, then the frequency range can be programmable configurated by selecting how many gates are used to form one one delay element.

Input 19 of the delay chain is connected to a local oscillator 23 which is controlled by a crystal Q and which furnishes a rectangular clock signal that corresponds in frequency to the data clock of the entire system. This oscillator should be a circuit having a modest precision of about $10^{-5}$.

A second important element is a flash register 25 which consists of (n+1) binary latches each of which can be loaded by the binary signal value that is available on either input line 19 or a respective associated tap 17-1, 17-2, ... 17-n of the delay chain, which is connected to its individual latch input. The latches are not interconnected. Loading is effected by an edge (transition) of the signal on control input line 27 which is connected to each of the latches. After loading, the contents (binary signal value) of each latch is available on a respective output line 29-0, 29-1, 29-2, ... 29-n. As such parallely loadable, edge triggered latch arrays are well known, no more detailed description need be given here.

A Schmitt trigger 31 is connected to data input 11 and to flash register control input 27. It furnishes a clean edge to the flash register after each transition of the binary (two-level) data input signal.

Another important element is an encoder 33 whose (n+1) inputs are connected to output lines 29-0, 29-1, 29,2, ... 29-n of flash register 25. This encoder has a bundle of parallel output lines 35 which furnish an encoded representation of the binary value sequence available in flash register 25 and on its output lines. As will be seen in more detail later, the flash register contains only three alternating groups of consecutive ones or zeros with two group transitions between them, and the encoder detects between which of its inputs the group transition from (e.g.) ones to zeros occurs. Thus, at its output it needs only identify the respective input which follows this group transition (e.g. the one containing the first zero after a group of ones). Assuming thirty inputs, output 35 will consist of five parallel lines which are sufficient to identify any one of up to thirty-two inputs. The coded output signal is designated as phase offset signal $\phi_{OFF}$ and is an indication of the phase difference between the last occurring data signal transition and the reference edge R of the basic local clock signal (cf. FIG. 2).

A further important element of the PLL is an output multiplexer 37. This is an array of (n+1) gates each of which is connected, respectively, to input 19 or one of the taps 21-1, 21-2, ... 21-n of delay chain 15. Only one of the (n+1) gates is selected at a time for transferring the signal of its associated input line (i.e. either the input signal or one of the tap signals of the delay chain) to the single output line of this multiplexer, which in turn is connected to the PLL data clock output, 13. Selection of the one active gate is made by a control signal that is furnished to a control input of the output multiplexer on a group of control lines 39.

The signal on control lines 39 is designated as phase selection signal $\phi_{MUX}$ for the output clock. It is furnished by a look-up table 41 of which one input is connected to output lines 35 of encoder 33 for receiving the phase offset signal $\phi_{OFF}$ and of which a second input is connected to its own output line 39 for receiving the current phase selection signal $\phi_{MUX}$. Look-up table 41 furnishes, in response to each coded phase offset signal $\phi_{OFF}$ identifying one of the (n+1) encoder inputs and to its current output $\phi_{MUX}$, a new coded output phase selection signal $\phi_{MUX}$ for selecting one of the (n+1) gates of output multiplexer 37. Thus, look-up table 41 essentially is a code converter and can be implemented e.g. in the form of a read-only memory (ROM) which is addressed by its two input values. If a programmable or an exchangeable ROM is used, the PLL parameters can be individually selected or changed separate from the PLL manufacturing process.

In a simplified version of the PLL, encoder 33 and look-up table 41 could be combined into a single encoder which directly converts the flash register contents into a coded phase selection signal for the output multiplexer.

(2) Operation of Fundamental Digital Flash PLL

Operation of the fundamental digital flash PLL described above will be explained in this section with reference to FIGS. 1, 2 and 3. As delay chain 15 has a total delay which corresponds to the clock period of the local oscillator 23, it should always contain two transitions of the locally generated clock signal, one from the upper binary signal level to the lower, and one in the other direction. These transitions propagate through the delay chain. Except for very short transitional intervals, one half of the delay chain taps will be at the upper signal level, and the other half at the lower signal level.

The data input signal on input line 11 is shaped by Schmitt trigger circuit 31 (FIG. 1). A transition of the output signal from the Schmitt trigger 31 loads the momentary values of the input signal (local clock) and the tap signals of the delay chain into the flash register latches (25). In FIG. 2, the flash register is represented with eight latches though it may be much longer (e.g. 32 latches). The flash register then contains an equal number of ones and zeros which represent the actual phase which the locally generated clock signal had when the input data signal transition occurred.

It is assumed that the data signal simply represents a binary one by the upper level, a binary zero by the lower level, that the sampling point is in the middle of each bit period, and that data signal transitions may occur at the bit period borders, i.e. in the middle between sampling points. Any other form of binary (two-level) data representation can of course be used, e.g. Manchester coding. The phase offset signal $\phi_{OFF}$ that is furnished by encoder 33 represents the phase shift between the input data signal and the basic local clock. The desired phase of the output clock on line 13 should be so, that its sampling edge S matches with the data sampling point (which is in the middle of each bit period).

FIG. 2 shows in its upper part the flash register and the delay element chain. Signal row I represents one period of the clock signal as stored in the delay chain when the last data signal edge occurred. Respective binary tap values are shown in the flash register. R is the reference edge marking the begin of a clock signal period, and S is the sampling edge corresponding to the middle of the clock period.

Row II of FIG. 2 depicts detection of the phase error, and rows III and IV depict two possible phase corrections for compensating the determined phase error.

The values of the phase offset, the phase error, and the phase correction as well as the phase selection value have to be expressed as integer numbers because each designates one of a finite number of discrete phase values (or tap positions).

It is assumed that the old phase selection value $\phi_{MUX(OLD)}$ selected tap 6 as output clock source. In the meantime, the new contents of the flash register caused determination of a phase offset $\phi_{OFF}$ having value 4. Thus, the phase error $\phi_{ERR}$ has value 2 as shown in row II.

This phase error could be corrected at once completely, by choosing a phase correction $\phi_{CORR}$ of value −2. The new phase selection value $\phi_{MUX(NEW)}$ would then be equal to 4, exactly corresponding to the determined phase offset (cf. row III of FIG. 2). However, such immediate correction would fully react to each error pulse and a jitter of the data clock output may appear, which is not desirable.

As improvement, only a partial or slow correction of the phase error could be effected in each clock cycle, as shown in row IV of FIG. 2. This improvement is formally shown as function $f(\phi_{ERR})$ in equation (2) below.

The phase correction is done using the following formulas:

The error phase is determined by $$\phi_{ERR} = \phi_{MUX(OLD)} - \phi_{OFF} \quad (1)$$

The phase correction is determined by $$\phi_{CORR} = -\phi_{ERR} + f(\phi_{ERR}) \quad (2)$$

where in $f(\phi_{ERR})$ the feedback characteristics are expressed. In a simple case as shown in row III of FIG. 2, $f(\phi_{ERR})$ would be zero.

The new output multiplexer setting is $$\phi_{MUX(NEW)} = \phi_{MUX(OLD)} + \phi_{CORR}. \quad (3)$$

These processing functions are implemented in the look-up table 41 of FIG. 1 (or in processor 43, FIG. 5 of the second embodiment to be explained later).

The phase shifting function of present PLL is explained with reference to FIG. 3. In this example, the delay chain has seven delay elements and thus it has a total of eight signal-furnishing output terminals (its input and the seven taps, respectively). The output terminals are designated as A ... H and the respective output clock signals are shown in lines A ... H of FIG. 3, respectively. As can be seen, the clock signal is available in eight different phase positions, and one of the output signals is selected by output multiplexer 37.

The selection of one output of multiplexer 37 is maintained as long as the contents of the flash register and thus the value of phase offset signal $\phi_{OFF}$ is not changed. As soon as a change occurs which is possible at each transition of the input data signal, a new multiplexer output selection, i.e. a shifting of the phase of the output clock of the PLL, is made.

One possible PLL characteristic, i.e. relation between phase error $\phi_{ERR}$ and phase correction $\phi_{CORR}$, is shown in FIG. 4. Any other desired correction function could be implemented in present PLL arrangement.

In the following Table 1, a sample is given for the contents of look-up table 41, implementing the correction function of FIG. 4. In this example, phase offset $\phi_{OFF}$ and phase selection $\phi_{MUX}$ can assume each one of the eight values from 0 ... 7, and phase error and phase correction can assume each one of the eight values from −4 ... 3. Table 1 shows which new phase selection value (tap selection number) is to be used for each pair of phase offset value and old phase selection value.

TABLE 1

| $\phi_{MUX(NEW)} = f(\phi_{MUX(OLD)}, \phi_{OFF})$ | | | | | | | | |
|---|---|---|---|---|---|---|---|---|
| ↓ | $\Phi_{OFF} \rightarrow$ | | | | | | | |
| $\Phi_{MUX(OLD)}$ | 0 | 1 | 2 | 3 | 4 | 5 | 6 | 7 |
| 0 | 0 | 1 | 1 | 2 | 2 | 6 | 7 | 7 |

TABLE 1-continued

| $\phi_{MUX(OLD)}$ ↓ | $\phi_{MUX(NEW)} = f(\phi_{MUX(OLD)}, \phi_{OFF})$ |  |  |  |  |  |  |  |
|---|---|---|---|---|---|---|---|---|
| | $\phi_{OFF} \rightarrow$ | | | | | | | |
| | 0 | 1 | 2 | 3 | ④ | 5 | 6 | 7 |
| 1 | 0 | 1 | 2 | 2 | 3 | 3 | 7 | 0 |
| 2 | 1 | 1 | 2 | 3 | 3 | 4 | 4 | 0 |
| 3 | 1 | 2 | 2 | 3 | 4 | 4 | 5 | 5 |
| 4 | 6 | 2 | 3 | 3 | 4 | 5 | 5 | 6 |
| 5 | 7 | 7 | 3 | 4 | 4 | 5 | 6 | 6 |
| ⑥ | 7 | 0 | 0 | 4 | ⑤ | 5 | 6 | 7 |
| 7 | 0 | 0 | 1 | 1 | 5 | 6 | 6 | 7 |

The encircled values correspond to the sample that is illustrated in FIG. 2.

(3) High Order Digital Flash PLL

For a high order PLL, i.e. one which operates with more sophisticated PLL-feedback characteristics, some modifications are required with respect to the fundamental PLL, which modifications are now described in a second embodiment of the invention which is shown in FIG. 5. Most units in the high order PLL are identical to those of the fundamental PLL and are designated by the same reference numbers as in FIG. 1.

In the high order PLL, the filter function must not only process or evaluate the present phase offset but must also use the error history, i.e. the effect of previous phase offsets, in order to achieve a more elaborate response of the PLL. This response can be expressed by the relation $\phi_{CORR} = -\phi_{ERR} + f(\phi_{ERR}(t=0)) + f(\phi_{ERR}(t=1)) + + f(\phi_{ERR}(t=2)) + \ldots$ For this purpose, the simple look-up table 41 that was used in the first embodiment (FIG. 1) for the filter function is replaced by a processor 43 that also has internal feedback connections. A more detailed description of this processor is given later with reference to FIG. 8.

For a smooth phase wrap around, the delay chain 15 must have a delay that exactly corresponds to the locally generated clock, i.e. to the output signal period of local oscillator 23. To allow reasonable tolerances a delay length encoder 47 is provided which inputs to the processor the effective delay chain length. This encoder compares the signal values at the last k (e.g. 4) delay chain taps to the signal value on delay chain input 19. The number of the tap lying between different values, which marks the effective end of the delay chain, is encoded and then furnished to the processor 43 over lines 49. The processor takes in account the actual delay length; it does not select (by multiplexer 37) the taps which supply an ambiguous phase, i.e. the taps after the effective end of the delay chain. A more detailed description of the delay length encoder is given further below with reference to FIG. 7.

The actual delay length of the delay chain 15 may change because of manufacturing tolerances, temperature and power supply effects and aging. Taking all the above mentioned cases into account a propagation delay distribution of the delay chain 15 will result which is shown in FIG. 6. From this distribution a compensation range and operating limits can be defined.

At nominal operating conditions, one of the k last taps, e.g. the tap 21-(n−1) outputs a signal having the same phase as the input signal on line 19. Between these two lines, exactly one clock period ($2\pi$) of oscillator 23 fits inside the delay chain. If the delay chain gets slower (i.e. the propagation delay through the delay elements is increased) less delay elements have to be used for fitting one clock period, e.g. only up to tap 21-(n−2). If the delay chain gets faster, more delay elements have to be used, e.g. up to tap 21-n.

This guarantees that the effective delay chain always contains exactly two clock signal transitions (one positive and one negative) but never one or three. Stated in other words: Output ambiguity is avoided.

An embodiment of delay length encoder 47 is shown in FIG. 7. It comprises four comparators or equivalence circuits 53-1, 53-2, 53-3, and 53-4 each of which has its first input connected to delay chain input line 19, and its second input to a respective associated one of the four last delay chain taps 21-(n−3) . . . 21-n. If both inputs are equal, the comparator furnishes a "1", otherwise a "0". The possible bit output combinations of the four comparators are 1000, 1100, 1110, or 1111. The last effective delay line tap is the one producing the last "1" in the group of four output bits. Encoder 51 encodes these four possible four-bit groups into one two-bit group which is furnished on lines 49 and which identifies one of the last four taps as the effective delay chain end.

An embodiment of processor 43 is shown in FIG. 8. It can be implemented as finite state machine with a programmable read only memory (PROM) so that it is suited for large scale integration, and can be loaded with the desired PLL characteristics after manufacturing. Thus a single design of the processor 43 can be used for different applications. Another possible implementation with a random access memory (RAM) enables an on-line loading of different parameter sets. Many parameter sets would be stored in some kind of supervisor microprocessor. According to some data input signal conditions (noise, external line type), one set of parameters is loaded then into processor 43.

Referring to FIG. 8, storage 61 containing the PLL parameters and state tables is the main part of processor 43. Input registers 63, 65 supply input signals "$\phi_{OFF}$" (from lines 35) and "DELAY LENGTH" (from lines 49) to the address lines of storage 61. The data output is transferred to output registers 67, 69. Output register 67 furnishes a value "$\phi_{MUX}$" over lines 39 to the multiplexer 37. Output register 69 is used for previous state values and program count. The contents of both output registers 67, 69 is fed back to the address lines of storage 61 over state feedback lines 73.

Thus, the output value $\phi_{MUX}$ of processor 43 depends not only on the current phase offset $\phi_{OFF}$ and the current delay length of the delay chain, but also on previous values of $\phi_{MUX}$ and $\phi_{OFF}$.

Loading of input registers 63, 65 and output registers 67, 69 is controlled by a sampling pulse from a clock circuit 71 which receives on its two inputs the output of local oscillator 23 on line 19 and the output of Schmitt trigger 31 on line 27. This clock circuit prevents loading when any transitions occurs to avoid ambiguities.

(4) Advantages of Digital Flash PLL/Summary

To summarize, following advantages are obtained with the digital flash phase locked loop arrangement of present invention:

None of the components needs to be suited for a higher frequency than the system clock frequency because the use of a higher frequency sampling or shifting clock is avoided. Thus, the arrangement can be used for very high clock frequencies in the order of 100 MHz.

The only unit that must be of relatively high precision is the local crystal oscillator. All other units can be of lower precision, thus allow cost reduction in manufacturing.

The PLL characteristics and/or the frequency range is digital programmable.

The whole PLL arrangement is well-suited for integrated circuit implementation.

I claim:

1. A device for synchronizing a source of clock signals with a received data signal comprising:
   a fixed frequency oscillator (23) providing a basic bi-level clock signal,
   a tapped delay chain (15) connected to said oscillator for receiving said basic bi-level clock signal,
   evaluation means (25, 33, 41/43) connected to the taps (19, 21-1 . . . 21-n) of said delay chain and responsive to each transition of a control signal furnished to a control input (27) of said evaluation means, for storing a set of momentary tap signal values and for generating a phase selection signal (39) from the stored set of momentary tap signal values,
   output gating means (37) connected to said delay chain taps (19, 21-1 . . . 21-n) and to said evaluation means (25, 33, 41/43) 16 and being responsive to said phase selection signal (39) for selectively gating the signal from one of said delay chain taps to a clock output line (13), and
   means (47, 49) for determining the effective delay chain length with respect to the clock signal period, and for furnishing this indication to said evaluation means.

2. Arrangement according to claim 1, characterized in that
   said delay chain (15) comprises a predetermined integer number n of delay elements (17-1, 17-2, . . . 17-n) each having a delay of about $T/(n+1)$, with T being the period of said bi-level clock signal furnished by said oscillator (23).

3. Arrangement according to claim 1, characterized by
   delay length encoding means (47) being connected to the input tap (19) and to the last k taps (21-(n−k−1), 21-(n−k−2), . . . 21n) of said delay chain (15), k being a predetermined integer number which is less than said number n, and having output lines (49) connected to said evaluation means (25, 33, 43), for providing an identification of the last one of said k taps whose present signal value corresponds to the present signal value on the first tap (19) of said delay chain, which is connected to said fixed frequency oscillator (23),
   whereby an indication of an effective delay line length with respect to the clock signal period of said oscillator (23) is furnished to said evaluation means.

4. Arrangement according to claim 1, characterized in that
   said evaluation means (25, 33, 41/43) comprises storage means (25) being connected to the delay chain taps (19, 21-1 . . . 21-n) and having a load control input line (27), for storing, in response to occurrence of a control signal transition at its control input line (27), a sequence of binary values representing the clock signal values present at all delay chain taps.

5. Arrangement according to claim 4, characterized in that
   said storage means (25) is an array of binary edge-triggered latches, each having a load control input that is connected to the common load control input line (27), and that
   the two signal levels of the bi-level clock signal generated by said local oscillator (23) and the two logic input signal levels of said binary latches of said storages means (25) correspond to each other.

6. Arrangement according to claim 4, characterized in that
   said evaluation means (25, 33, 41/43) further comprises encoder means (33) connected to outputs of said storage means (25) for generating, on an output line (35) a phase offset signal value $\phi_{OFF}$ in response to the sequence of binary values stored in said storage means.

7. Arrangement according to claim 6, characterized in that
   said evaluation means (25, 33, 41) further comprises table look-up means (41) connected to the output (35) of said encoder means (33) and having a plurality of phase selection signals stored therein, which furnishes at its output one of said phase selection signals in response to a phase offset signal $\phi_{OFF}$ received from the encoder output (35).

8. Arrangement according to claim 6, characterized in that
   said evaluation means (25, 33, 43) further comprises a processor (43) connected to the output (35) of said encoder means (33) for receiving said phase offset signal $\phi_{OFF}$, and for generating in response to current phase offset value and previous phase offset values, a phase selection signal that is furnished at an output (39) which is connected to a control input of said output gating means (37).

9. Arrangement according to claim 4, characterized in that
   a Schmitt trigger (29) is provided whose output is connected to the load control input line (27) of said storage means (25), and whose input is connected to a PLL input line (11) which is provided for applying a data signal.

10. Method for providing a clock signal synchronized to a received data signal, characterized by the steps of:
    locally generating a bi-level clock signal of given frequency;
    feeding said bi-level clock signal to a tapped delay chain;
    detecting each level transition in said received data signal;
    storing the set of momentary signal values available at all taps of said delay chain when a level transition in the received data signal occurs;
    determining the effective delay chain length with respect to the clock signal period; and
    determining a selection value in response to said stored set of momentary signal values, for selecting one of said taps of said delay chain within said effective delay chain length;
    whereby said delay chain is used simultaneously for determining a phase offset between said received data signal and said locally generated clock signal by evaluating its tap output values and for obtaining a phase shifted clock signal by selecting one of its taps as clock output.

11. Method according to claim 10, characterized in that
    a control signal edge is derived from each data input signal transition, and that each control signal edge controls the transfer of all tap output values of the delay chain to a storage array.

12. Method according to claim 11, characterized in that a phase offset value is generated by encoding the ensemble of all said tap output values available in said storage array, in accordance with a given coding rule.

13. Method according to claim 12, characterized in that said phase offset value is used as an address for accessing a stored phase selection value contained in a stored look-up table of phase selection values, and that said accessed phase selection value is used for controlling the selection of one of said delay chain tap outputs.

* * * * *